(12) United States Patent
Dokumaci et al.

(10) Patent No.: US 6,803,315 B2
(45) Date of Patent: Oct. 12, 2004

(54) METHOD FOR BLOCKING IMPLANTS FROM THE GATE OF AN ELECTRONIC DEVICE VIA PLANARIZING FILMS

(75) Inventors: Omer H. Dokumaci, Wappingers Fall, NY (US); Bruce B. Doris, Brewsters, NY (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 10/212,938

(22) Filed: Aug. 5, 2002

(65) Prior Publication Data

US 2004/0023500 A1 Feb. 5, 2004

(51) Int. Cl.$^7$ ............................................. H01L 21/302
(52) U.S. Cl. ...................... 438/692; 438/694; 438/289; 438/659
(58) Field of Search ................................ 438/691–694, 438/697, 241, 253–257, 289, 659

(56) References Cited

U.S. PATENT DOCUMENTS

| 5,518,961 A | * | 5/1996 | Ishimaru ..................... 438/586 |
| 5,891,784 A | | 4/1999 | Cheung et al. |
| 6,118,161 A | | 9/2000 | Chapman et al. |
| 6,232,188 B1 | | 5/2001 | Murtaza et al. |
| 6,274,489 B1 | * | 8/2001 | Ono et al. ................... 438/659 |
| 6,284,592 B1 | * | 9/2001 | Lee ............................. 438/241 |
| 6,596,599 B1 | * | 7/2003 | Guo ............................ 438/305 |
| 2001/0011756 A1 | | 8/2001 | Yu |

FOREIGN PATENT DOCUMENTS

| EP | 0 771 021 A2 | 6/1991 |
| JP | 8097421 A | 4/1996 |
| JP | 10189959 A | 7/1998 |

* cited by examiner

Primary Examiner—Kin-Chan Chen
(74) Attorney, Agent, or Firm—Graham Jones; Margaret A. Pepper (57) ABSTRACT

A method is provided for blocking implants from the gate electrode of an FET device. Form a first planarizing film covering the substrate and the gate electrode stack. The first planarizing film is planarized by either polishing or self-planarizing. For deposition by HDP or use of spin on materials, the film is self-planarizing. Where polishing is required, the first planarizing film is planarized by polishing until the top of the gate electrode is exposed. Etch back the gate electrode below the level of the upper surface of the first planarizing film. Then deposit a blanket layer of a second planarizing film and polish to planarize it to a level exposing the first planarizing film, forming the second planarizing film into an implantation block covering the top surface of the gate. Remove the first planarizing film. Form the counterdoped regions by implanting dopant into the substrate using the implantation block to block implantation of the dopant into the gate electrode. The implantation block protects the gate electrode of the FET from unwanted implanted impurities during implanting of the counterdoped regions. The first planarizing film is composed of a material selected from the group consisting of HDP (high density plasma) silicon oxide and HDP silicon nitride, an interlevel-dielectric layer material including ONO, and photoresist. The gate electrode is composed of a material selected from the group consisting of polysilicon and metal. The second planarizing film comprises a material such as HDP oxide, HDP nitride, and an organic layer including ARCs. The second planarizing film comprises a different material from the first planarizing film.

20 Claims, 5 Drawing Sheets

METHOD FOR BLOCKING IMPLANTS FROM THE GATE OF AN ELECTRONIC DEVICE VIA PLANARIZING FILMS

BACKGROUND OF THE INVENTION

1. Field of the Invention

This invention relates to forming a FET (Field Effect Transistor), and more particularly to a method of protecting the gate electrode of the FET from implants of unwanted impurities during implantation of regions of the FET. The FET is a Metal Insulator Semiconductor FET (MISFET) such as a Metal Oxide Semiconductor FET (MOSFET) where the insulator is an oxide and the "Metal" is a conductor such as doped polysilicon or a metal conductor.

2. Description of Related Art

U.S. Pat. No. 5,891,784 of Cheung et al. for "Transistor Fabrication Method" describes forming an anti-channeling hard mask in the form of an anti-channeling monolayer or a bilayer of doped silicon dioxide (BPSG or PSG), silicon nitride or silicon oxynitride between 100 Å and 4000 Å above a gate electrode stack, with no sidewall spacers having been formed when shallow junctions are being formed in the substrate. The anti-channeling hard mask can comprise a bilayer of undoped silicon oxide covered with doped silicon oxide or covered with silicon nitride. Alternatively an anti-channeling hard mask layer of doped silicon oxide may be progressively doped more heavily from bottom to top. The purpose is to prevent penetration of dopants through the gate electrode into the channel without protecting the gate electrode from the implanted dopant.

European patent application No. EP 0 771 021 of Chittipeddi et al. for "Transistor Fabrication Method" describes covering the gate electrode with a protective layer before ion implantation to prevent channeling. A protective oxide layer is formed on both the gate electrode stack and the substrate, but it is thicker on the gate electrode stack than on the substrate. The process uses differential oxidation to create a thicker silicon oxide layer on top of the polysilicon than on the underlying silicon to block implants from reaching the gate electrode, but will block them from reaching the extension also.

JP8097421A of Hiroshi et al for "Manufacture of Semiconductor Device" is directed to preventing the substrate of a device from being damaged during RIE, by performing a partial RIE after deposition of a silicon oxide spacer, implanting S/D and etching the rest of the silicon oxide. That process will not block the S/D implants from reaching the gate electrode.

U.S. patent application publication No. 2001/0011756 A1 of Yu for "Method for Forming Shallow Source/Drain Extension for MOS Transistor" performs implantation of an amorphization substance such as silicon or germanium into the substrate to form source and drain extensions under the gate in a process using a silicon oxynitride ($SiO_xN_y$) hard mask to prevent implantation of the gate. Then after the amorphization step, sidewall spacers are formed alongside the gate electrode. Next, dopant is implanted into the substrate to form S/D with the hard mask protecting the gate electrode using the silicon oxynitride ($SiO_xN_y$) hard mask again, to prevent implantation of the gate.

JP10-189959A of Horiuchi Katsutada for "Semiconductor Device" describes use of a hard mask and the gate electrode itself to block Arsenic (As) from reaching the substrate to prevent the substrate floating effect. Subsequently, there is a step of vertical ion implantation of Argon (Ar) followed by heat treatment to create a crystal defect region of polycrystals at the interface with an insulating film. The substrate floating effect can exist in an SOI-MOS structure in which a MOS transistor is formed on an insulating substrate or film in which the substrate region of the MOS transistor is floated. As the drain voltage rises, holes among pairs of electrons and holes generated by the impact ionization of channel carriers stay in the substrate region and bias the substrate region positive which causes the threshold voltage to drop, so the drain currents increase suddenly, rendering the potential of the substrate region of the SOI-MOS transistor unstable. This instability is referred to as the "substrate floating effect". In addition, ionization is generated near the end portion of the drain region due to a small amount of the leakage current between the and drain.

U.S. Pat. No. 6,232,188 of Murtaza et al for "CMP-Free Disposable Gate Process" describes a disposable gate process which avoid use of Chemical Mechanical Polishing (CMP). A High Density Plasma Chemical Vapor Deposition (HDP-CVD) field dielectric composed of silicon oxide blocks implants from reaching S/D while leaving portions of the disposable gate exposed. The disposable gate is removed and then the gate electrode is deposited subsequently.

U.S. Pat. No. 6,118,161 of Chapman et al. for "Self-Aligned Trenched-Channel Lateral-Current-Flow Transistor" describes a disposable gate process in which source/drain (S/D) regions "may be implanted using the disposable gate as an implant block . . . " Later the disposable gate is completely removed.

R. B. Fair, "Modeling Boron Diffusion in Ultrathin Nitrided Oxide $p^+Si$ Gate Technology", IEEE Electron Device Lett., 18, 244 (1997) discusses thin gate dielectric materials, i.e. nitrided oxide films and the effects of fluorine and boron thereon.

M. Navi, and S. T. Dunham, Investigation of Boron Penetration Through Thin Gate Dielectrics Including Role of Nitrogen and Fluorine" J. Electrochem. Soc., 145, 2545 (1998).

SUMMARY OF THE INVENTION

The extension and source drain implants which also get implanted into the gate can cause problems for MIS/MOS devices. Thus, it is desirable to completely uncouple the gate implants from the extension and source drain implants of an FET device. For example, for a PFET, the extension implant regions and the source/drain implant regions can contain boron difluoride ($BF_2$.) Boron difluoride ($BF_2$) is amorphizing at the doses used in extension or S/D formation. Therefore the channeling of boron is reduced during a $BF_2$ implant. Boron diffusion is also suppressed during subsequent anneals because of the presence of fluorine in the extension implant regions and the source/drain implant regions. Therefore, it is easier to get ultra-shallow junctions with $BF_2$ than with boron alone. However, as the unwanted presence of fluorine in the gate electrode increases, there is an increasing problem of diffusion of extra fluorine from the $BF_2$ implant passing from the gate electrode through the gate dielectric into the underlying channel region. The extra fluorine from the $BF_2$ implant in the channel region is detrimental to MIS/MOS devices. It is well known that incorporation of fluorine into gate dielectric layers enhances boron diffusion in a process referred to as "boron penetration". Boron penetration compromises the characteristics of gate dielectric layers and adversely affects the characteristics of the devices in which the condition of boron penetration exists. This is especially a big problem with ultra-thin silicon oxides (15 Å) and high-k dielectrics that are currently being developed in the semiconductor industry. Accordingly, there is a need to protect the gate electrode from fluorine containing implants to prevent penetration thereof through the gate dielectric reaching the channel region (therebelow) in the substrate of the FET device.

Sometimes it is desirable to implant the S/D and/or extension region with a diffusion retarding species/element such as carbon in order to obtain ultra-shallow junctions. However, if carbon is introduced into a polysilicon gate electrode, dopant diffusion in the gate electrode can be suppressed. If the dopant does not diffuse to the bottom of the gate electrode, the resulting polysilicon depletion will be detrimental to the performance of the MOS device. For optimal device design, a polysilicon gate electrode must be protected from diffusion retarding species.

A polysilicon gate electrode is usually doped heavily to increase the polysilicon activation and minimize polysilicon depletion effects. If the S/D implant is also implanted into a polysilicon gate electrode, the dopant concentration reach a high enough concentration to affect silicidation on the gate electrode adversely. Proper silicide formation is extremely important in obtaining low resistance polycide gate electrodes and reducing the problem of propagation delay. Thus, it is desirable to protect a polysilicon gate electrode from the S/D implant to get good silicide formation.

Integrating metal gates into a CMOS process has gained much interest lately because of the complete elimination of the polysilicon depletion effects and therefore decreasing the electrical thickness of the gate dielectric inversion layer thickness ($t_{inv}$) Wolf "Silicon Processing for the VLSI Era, Vol. 3, pp. 150–151 Lattice Press (1995). If a metal gate is formed before S/D or extension implants, it will be necessary to protect the metal from implants so that the structural integrity and the electrical properties of the metal will not be affected adversely.

The present invention solves the problem of protecting the gate from harmful extension and S/D implants. This is extremely important for advanced logic technologies. In order to obtain ultra-shallow junctions and ultra-sharp halos, these technologies require implants that contain carbon and fluorine. To solve the problem of preventing species such as carbon and fluorine (which comprise unwanted impurities in the gate electrode) from being introduced into the gate electrode, the present invention provides a way to block implants of carbon and fluorine into the gate electrode, whether it is formed of either doped polysilicon or metal.

In the prior art, as can be seen from the above description of the art, use of a hard mask to create a implant block layer is a very well known technique. The process of the present invention is different from the hard mask process.

The process of the present invention has four major advantages:

1) The process of the present invention can be performed at any point during the CMOS process flow. The hard mask process can be performed only during gate electrode patterning. Therefore the hard mask film is subject to other processes that can harm the hard mask before it can be employed as an implant block layer.

2) The process of the present invention can be repeated many times during the CMOS process flow whereas the hard mask process can be performed only once.

3) The process of the present invention is performed after the gate electrode patterning. The hard mask process is performed during gate electrode patterning. The hard mask film is usually chosen to minimize the Critical Dimension (CD) of lithography and to minimize the CD variation across the wafer. That restricts the type of film that can be used as a hard mask or as a implant block layer (usually just oxide). In the process of the present invention, any planar film can be used, e.g. ARC, a spin-on dielectric polymer (e.g SiLK semiconductor dielectric, the Dow Chemical Co. which is an aromatic hydrocarbon thermosetting polymer), silicon oxide, etc.

4) The process of the present invention can use organic films as an implant block layer, which can be very selectively removed with respect to silicon oxide, silicon nitride, and silicon. On the other hand, a hard mask process cannot use organic films as an implant block layer since these films are thermally unstable.

In accordance with this invention, a method is provided for the manufacture of a Metal Insulator Field Effect Transistor (MISFET) or a Metal Oxide Field Effect Transistor (MOSFET) by blocking implants from the gate electrode stack of a gate dielectric and a gate electrode of an FET device by the following steps. Form a first planarizing film covers the substrate and the gate electrode stack. Planarize the first planarizing layer by polishing until the upper surface of the gate electrode is exposed. Etch back the gate electrode below the level of the upper surface of the first planarizing film. Deposit a second planarizing film on top of the gate electrode and the first planarizing film. Polish the second planarizing film down to a level which exposes the first planarizing film while leaving a substantial thickness of the second planarizing film to form a cap comprising an implantation block covering the top surface of the gate electrode. Selectively remove the first planarizing film to open access for implantation into lateral regions in the surface of the substrate aside from the gate electrode stack whereby the counterdoped regions can be formed. Form the counterdoped regions by implanting dopant into the substrate using the implantation block to block implantation of the dopant into the gate electrode. The implantation block formed from the second planarizing film protects the gate electrode of the FET device from unwanted implanted impurities during implanting of the counterdoped regions. The first planarizing film is composed of a material selected from the group consisting of HDP (high density plasma) silicon oxide and HDP silicon nitride, an interlevel-dielectric layer material including ONO (silicon Oxide/silicon Nitride/silicon Oxide), and photoresist. The gate electrode is composed of a material selected from the group consisting of polysilicon and metal. The second planarizing film is composed of a material selected from the group consisting of HDP silicon oxide, HDP silicon nitride, and an organic layer including ARCs (Anti-Reflective Coatings). The second planarizing film is composed of a material different from the first planarizing film.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

1) Substrate

Figure 1A:
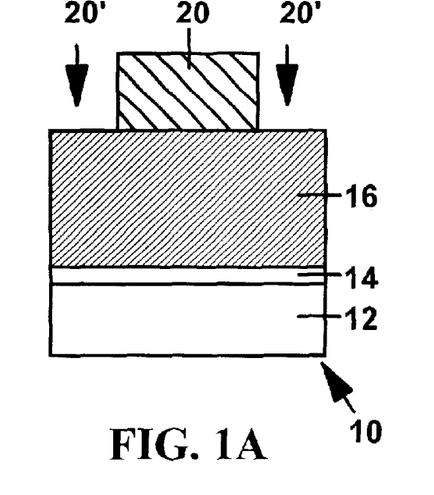
FIGS. 1A–1I show a series of steps of forming FET devices in accordance with the dual planarization layer process of this invention.
Figure 2A:
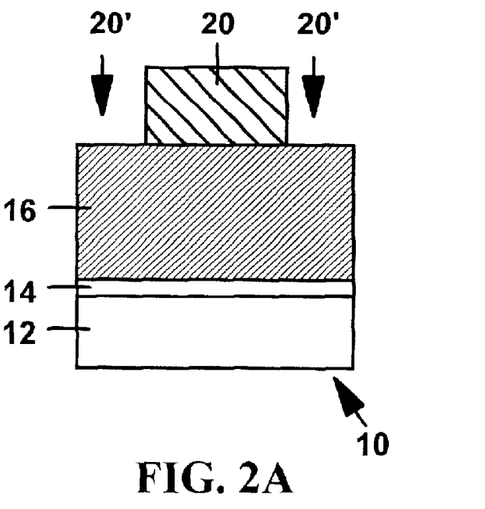
FIGS. 2A–2I show a modification of FIGS. 1A–1I in which the series of steps of forming FET devices in accordance with the dual planarization layer process of this invention is performed with sidewall spacers adjacent to the gate electrode of the FET device.

Referring to FIGS. 1A and 2A, Metal Insulator Semiconductor FET (MISFET) type of devices 10, which may be MOSFETs, are manufactured by a process which is begun starting with a substrate 12 which is preferably composed of bulk silicon or can comprise a silicon layer formed upon an insulating body in accordance with the well known SOI (Silicon on Insulator) technology. As will be well understood by those skilled in the art, the substrate 12 can include well regions and isolation regions aside from the elements seen in the drawings.

GATE ELECTRODE STACK FORMATION

2) Formation of Gate Insulator Layer

Referring again to FIGS. 1A and 2A, a thin film gate insulator layer 14 is deposited or grown on the surface of a doped semiconductor substrate 12. Preferably, the thin film gate insulator layer 14 is composed of silicon oxide ($SiO_x$) or silicon oxynitride ($SiO_xN_y$) The gate insulator layer 14 can be formed as a blanket layer by a thermal growing process, e.g. oxidation, nitridation or oxynitridation. Alternatively, instead of silicon oxide ($SiO_x$) or silicon oxynitride ($SiO_xN_y$), the gate insulator layer 14 can be composed of a high-k material, e.g. zirconium dioxide ($ZrO_2$), alumina ($Al_2O_3$) or hafnium dioxide ($HfO_2$). These materials can be formed by processes such as Chemical Vapor Deposition (CVD), plasma-assisted CVD, Atomic Layer CVD (ALCVD), evaporation or chemical solution deposition.

3) Formation of Gate Material

Figure 1B:
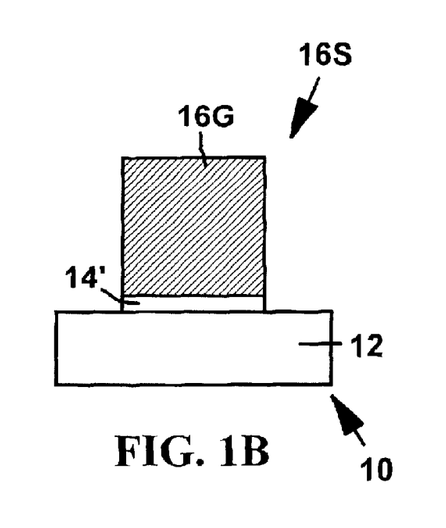
Figure 2B:
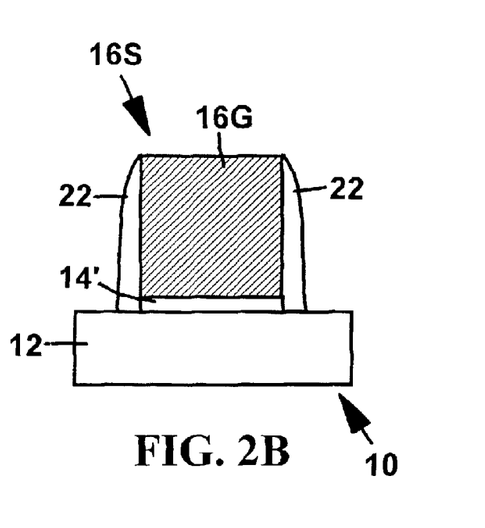

Continuing to refer to FIGS. 1A and 2A, the next step is to form a thick layer of a conductive gate electrode material 16 (for forming a gate electrode 16G shown is FIGS. 1B and 2B). A blanket layer of the gate electrode material 16 is deposited on the surface of the gate insulator layer 14. The gate electrode material 16, which is preferably composed of a layer of polysilicon (Poly) or amorphous silicon (a-Si), can be deposited as a blanket layer by CVD, plasma-assisted CVD, evaporation, electroless plating or electroplating, or chemical solution deposition. The Poly or a-Si comprising the gate electrode material 16 can be doped or undoped at this point in the process, in accordance with conventional semiconductor manufacturing practice, within the discretion of the designer of the chip manufacturing process. Preferably, the doping of the gate electrode material 16 is deferred until later in the manufacturing process.

4) Patterning of Gate Electrode Stack

Next, as shown in FIGS. 1A and 2A, a photoresist mask 20 (only a portion of which is shown for convenience of illustration) has been formed with windows 20' therethrough (for patterning a gate electrode stack 16S shown in FIGS. 1B and 2B) by means of the conventional photolithography process, which has been used to pattern a blanket photoresist layer into the photoresist mask 20 shown in the drawings. The photolithography step includes forming the mask 20 by applying a blanket layer of photoresist to the gate electrode material 16, exposing the photoresist 20 to a pattern of radiation, followed by developing the pattern into the photoresist mask 20 utilizing a conventional developer solution.

FIGS. 1B and 2B show the devices 10 of FIGS. 1A and 2A after using the mask 20 to form the gate electrode stacks 16S by etching through the windows 20' to form the gate electrodes 16G in combination with the gate insulators 14' therebelow, thereby exposing the surface of the substrate 12 aside from the gate electrode stack 16S. In other words, in this step, aside from the mask 20, the exposed portions of the gate material 16 and the gate insulator layer 14 are completely removed by etching. This leaves the gate electrode stack 16S, which is shown after removal of the mask 20 therefrom.

The etching process used can be selected from dry etching processes such as Reactive Ion Etching (RIE), plasma etching, ion beam etching and laser ablation, inter alia. After completion of the dry etching process step or steps, the photoresist mask 20, in turn, was completely removed by a conventional stripping process well known in the art in order to provide the structure shown in FIG. 1B. As shown in FIGS. 1B and 2B, the result is that gate electrode stacks 16S have substantially vertical sidewalls.

SPACER FORMATION

5) Formation of Sidewall Spacers (Optional)

The structure in FIG. 2B is shown after formation of the gate electrode stack 16S thereof has been completed followed by formation of optional sidewall spacers 22 on the vertical sidewalls of the gate electrode 16G of FIG. 2B.

Preferably the sidewall spacers 22 are formed of silicon nitride ($Si_3N_4$) material, which can be deposited by CVD or plasma-assisted CVD preferably as a conformal blanket layer. The sidewall spacers 22 are formed by etching back the conformal blanket layer anisotropically with a conventional dry etching process such as RIE or plasma etching to leave the sidewall spacers 22 as shown in FIG. 2B.

FIRST PLANARIZING FILM

6) Deposition of First Planarizing Film

Figure 1C:
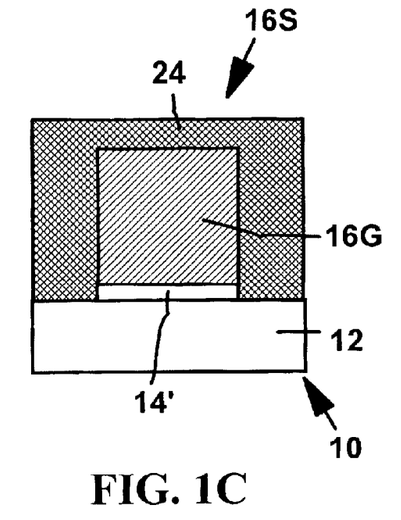
Figure 2C:
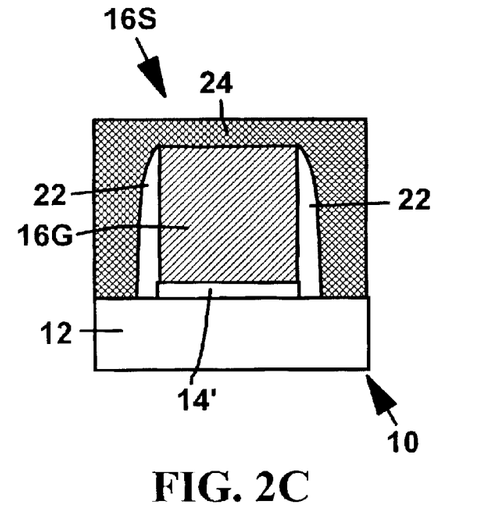

FIGS. 1C and 2C show the devices 10 of FIGS. 1B and 2B after forming a blanket coating thereon of a first planarizing film 24, starting by deposition of a of thick oxide, or BPSG layer, an interlevel dielectric material, e.g. ONO (silicon Oxide/silicon Nitride/silicon Oxide), or photoresist. Deposition thereof can be done using a process such as CVD, plasma enhanced CVD (PECVD), high-density plasma (HDP), or alternatively by CVD/PECVD with TEOS or CVD with ozone TEOS. An oxide can also be deposited by a spin-on process.

7) Planarization of First Planarizing Film

Figure 1D:
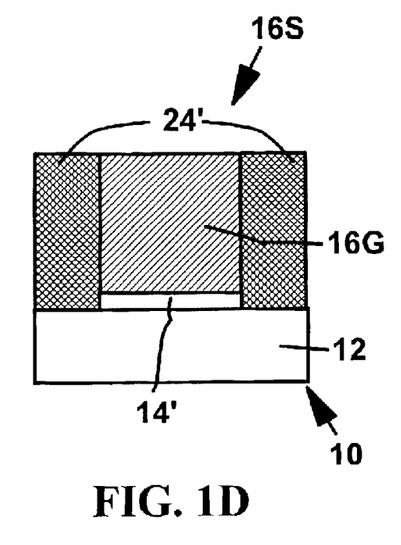
Figure 2D:
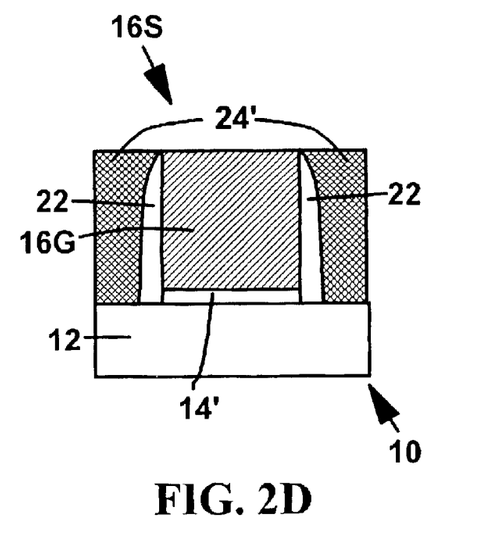

FIGS. 1D and 2D show the devices 10 of FIGS. 1C and 2C after the first planarizing film 24 has been formed. As to the planarization of the first planarizing film 24, when the materials that form film 24 are applied with a HDP process or a spin on process, the film is self-planarizing. On the other hand, in cases in which polishing is required, the step of polishing the surface of the first planarizing film 24 (silicon oxide layer or BPSG) is performed until a lowered first planarizing film 24' remains. The lowered first planarizing film 24' has a top surface the upper level of which is low enough to expose the gate electrodes 16G at or below the level thereof shown in the previous drawings, i.e. the top surface of the gate electrodes 16G may have been partially removed during planarization, if the polishing continues after the top surfaces of the gate electrodes 16G are exposed.

The polishing of film 24 is preferably performed by chemical-mechanical-polishing (CMP), and as stated above, it lowers the first planarizing film 24 down to a level that exposes the top surface of the gate electrodes 16G, each of which is shown sandwiched between the left and right sides of the lowered first planarizing film 24'. The thickness of the first planarizing film 24 (silicon oxide layer or BPSG) is larger than the gate thickness and can be as thick as about 5000 Å. The first planarizing film 24 can also comprise a deposit of an interlevel-dielectric layer, e.g. ONO, which has been planarized by CMP.

The lowered first planarizing film 24' can also be formed by the photoresist method as disclosed in commonly assigned, U.S. patent application Ser. No. 09/882,250, filed 15 Jun. 2001 of Omer H. Dokumaci, et al. for "Anti-Spacer Structure for Improved Gate Activation" (FIS9-2001-0043-US1).

The preferred materials to be employed as the first planarizing films 24 are the HDP silicon oxide/silicon nitride ($SiO_2/Si_3N_4$) or a planarized (CMP) interlevel dielectric layer.

ETCH BACK GATE

8) Etch Back Top Surfaces of Gate Electrodes to Form Recessed Surfaces

Figure 1E:
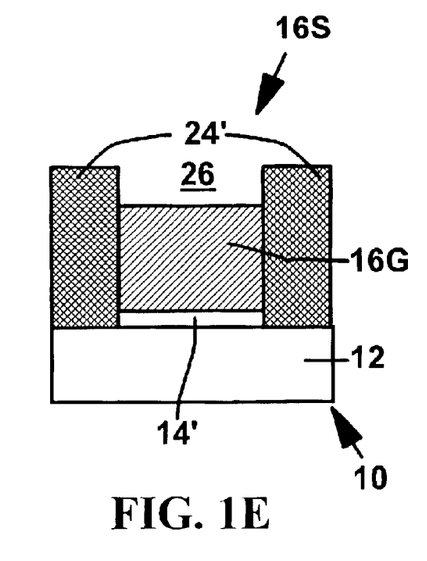
Figure 2E:
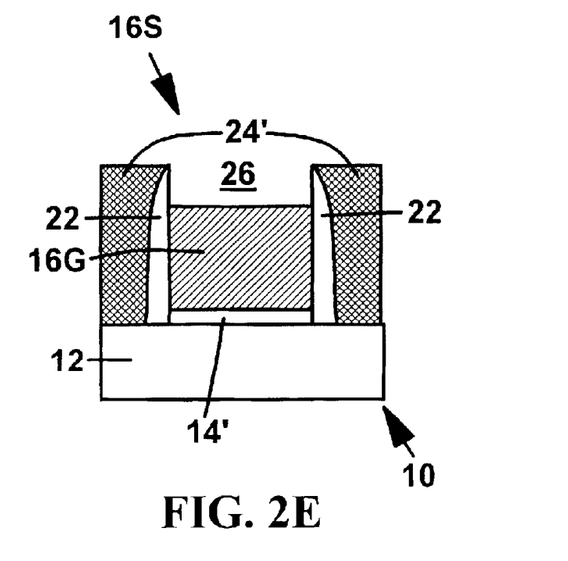

FIGS. 1E and 2E show the devices 10 of FIGS. 1D and 2D after performing the step of etching back the exposed top surface of the gate electrodes 16G utilizing a conventional dry etching process such as RIE or plasma etching to form an etched back recesses 26 surrounded by vertical sidewalls of the lowered first planarizing film 24' in FIG. 1E and of the sidewall spacers 22 in FIG. 2E. Preferably, the depth of the etched back recesses 26 extends to a depth below the surface of lowered first planarizing film 24' of FIG. 1E and FIG. 2E between about 100 Å and about 500 Å.

SECOND PLANARIZING FILM

9) Deposition of Second Planarizing Film and Planarization Thereof

Figure 1F:
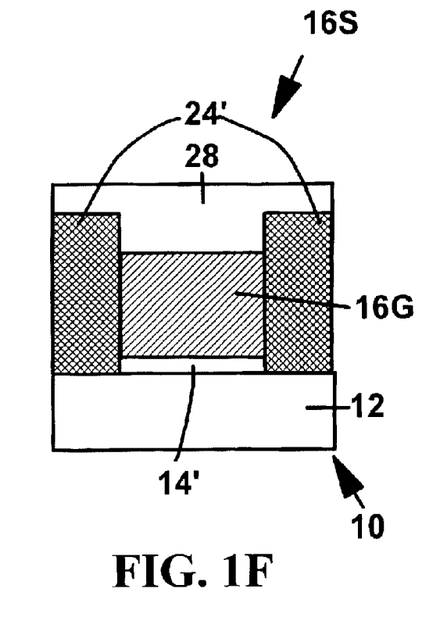
Figure 2F:
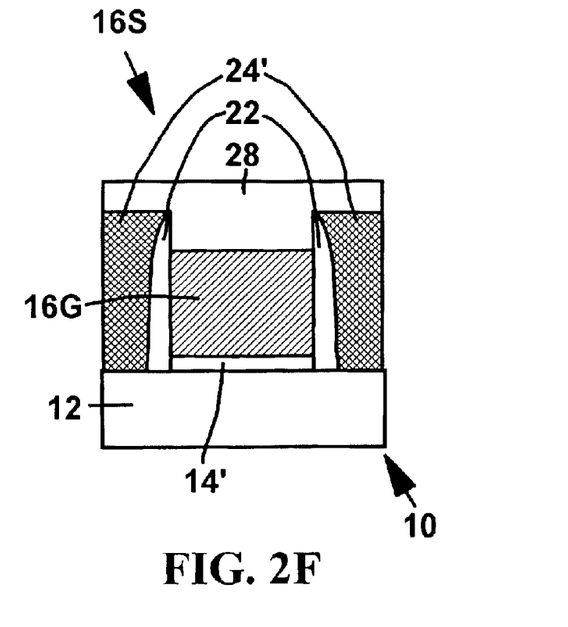

FIGS. 1F and 2F show the devices 10 of FIGS. 1E and 2E after deposition of a blanket layer of a second planarizing film 28. First, the second planarizing film 28 is deposited as a thick blanket layer covering devices 10 and filling the recesses 26. The following step is to planarize the second planarizing film 28 down to the level of the top surface of the first planarizing film 24'. The second planarizing film 28 is preferably an organic film adapted to be used for planarization. The deposition process employed in forming the second planarizing film 28 may be selected from CVD, Plasma Enhanced CVD (PECVD), evaporation, chemical solution deposition or spin-on coating. If needed, the deposited second planarizing film 28 may be baked at a temperature which is capable of removing any residual solvent from the film 28. The baking step is usually carried out from 150° C. to 250° C. The thickness of the second planarizing film 28 is preferably between about 100 Å and about 1000 Å. The second planarizing film 28 includes an organic polymer or mixtures thereof. Examples of suitable materials for the second planarizing film 28 include Anti-Reflective Coatings (ARC), acrylic elastomers such as polyacrylate rubbers and polyimides.

An example of a suitable ARC material is DUV-30 ARC (manufactured by Brewer Science, Inc.) An example of a suitable acrylic elastomer is Nipol®AR14 polyacrylate rubber (available from Zeon Chemicals LP, Louisville, Ky.) Nipol®AR14 contains one or more acrylic esters with a small percentage of a chlorine reactive cure site. (Nipol® is a Registered Trade Mark of Nippon Zeon Co., Ltd. Corporation, Japan).

In cases in which an organic film is employed as the second planarizing film 28 that covers the lowered first planarizing film 24', the second planarizing film 28 should be etched back to expose the lowered first planarizing film 24'. The methods for etching include RIE or wet chemical etching.

The second planarizing film 28 can also comprise a deposit of an interlevel-dielectric layer which has ben planarized by CMP, but of course it must be capable of withstanding a selective etch in step 11 below when the lowered first planarizing film 24' is being etched away, as will be well understood by those skilled in the art of manufacturing FET devices.

The second planarizing film 28 can also be obtained by the photoresist method as disclosed in commonly assigned, U.S. patent application Ser. No. 09/882,250, filed 15 Jun. 2001 of Omer H. Dokumaci, et al. for "Anti-Spacer Structure for Improved Gate activation" (FIS9-2001-0043-US1).

The preferred films are the HDP silicon oxide/silicon nitride ($SiO_2/Si_3N_4$) or a planarized (CMP) interlayer dielectric layer, e.g. ONO (silicon Oxide/silicon Nitride/silicon Oxide), for the first planarizing film 24' (as stated above) and an Anti-Reflection Coating (ARC) for the second planarizing film 28.

Note that a restriction on this process is that the first planarizing film 24' cannot be a thermally unstable film if the second planarizing film 27 is deposited at high temperatures (i.e. greater than about 200° C.).

10) Planarization of Second Planarizing Film

Figure 1G:
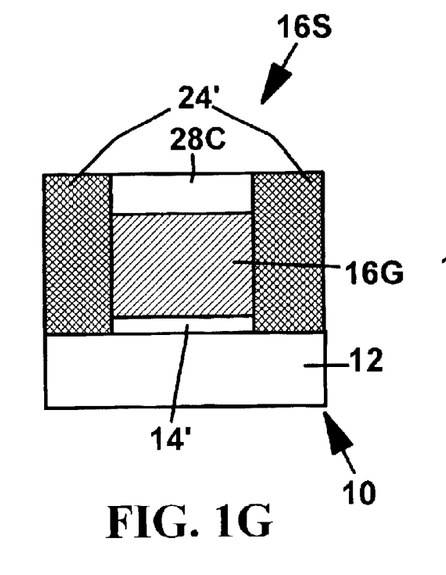
Figure 2G:
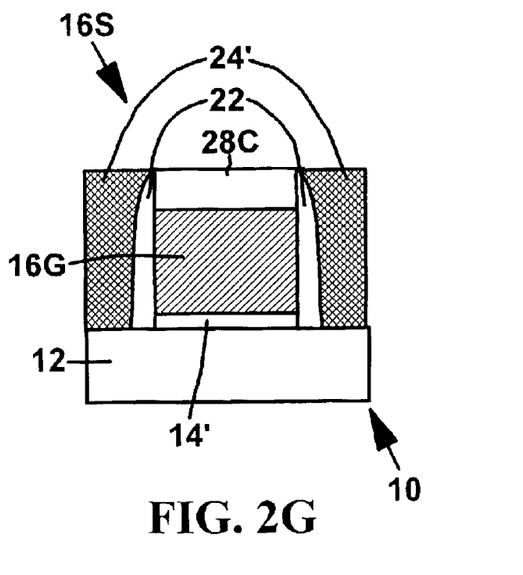

FIGS. 1G and 2G show the device 10 of FIGS. 1F and 2F after planarizing the second planarizing film 28 down to a level exposing the lowered first planarizing film 24 forming implantation blocking caps 28C. The process of planarization of the second planarizing film 28 can be achieved by using a selective, conventional dry etching process such as RIE or plasma etching level exposing, which does not necessarily remove the remainder of the first planarizing film 24', while leaving a implantation blocking cap 28C comprising a remaining portion of the second planarizing film 28 covering the top surface of the gate electrode 16G. The implantation blocking cap 28C has a substantial thickness which is sufficient to block the ion implantation of boron difluoride or other impurities into the gate electrode 16G during implantation, as described in step 12 below. Preferably the thickness of the implantation blocking cap 28C is between about 100 Å and about 500 Å.

ETCH THE FIRST PLANARIZING FILM

11) Etch the First Planarizing Film.

Figure 1H:
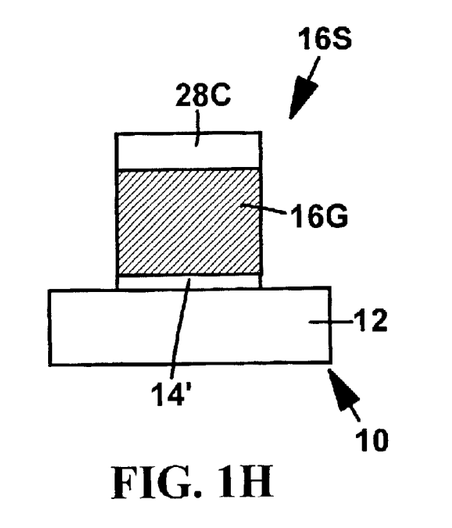
Figure 2H:
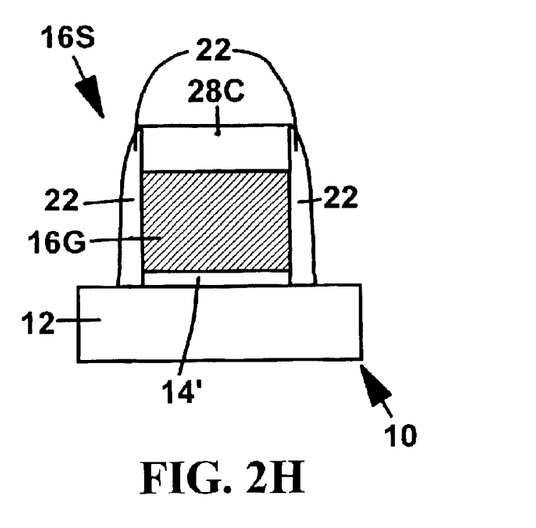

FIGS. 1H and 2H show the devices 10 of FIGS. 1G and 2G after the lowered first planarizing film 24' has been removed therefrom. If the lowered first planarizing film 24' is composed of a silicon oxide or BPSG, it can be etched away either by a wet or dry etching process leaving the surface of the substrate 12 exposed adjacent to the stack of the implantation blocking cap 28C, the gate electrode 16G and the gate dielectric 14'. The lowered first planarizing film 24' can be removed in a bath of hydrogen fluoride (HF) at room temperature. Alternatively, if the lowered first planarizing film 24' is composed of silicon oxide it can also be selectively etched with a dry etch utilizing $CHF_3/CF_4$.

IMPLANT (BLOCKED AT THE GATE)

Figure 1I:
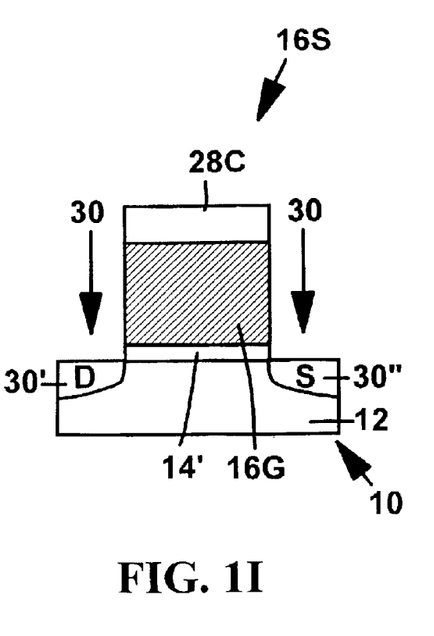
Figure 2I:
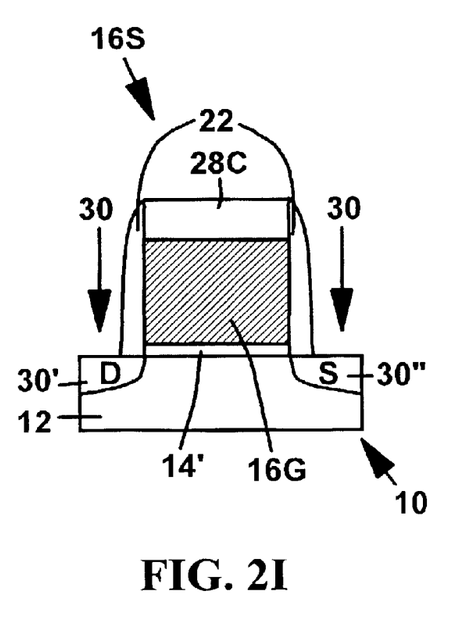

12) Extension/halo or S/D Implants 30S/30D:

FIGS. 1I and 2I show the devices 10 of FIGS. 1H and 2H after forming counterdoped regions 30'/30" by ion implanting of dopant 30 into regions 30'/30" into the substrate 12 shown juxtaposed therewith. As will be well understood by those skilled in the art, there may be shallow extension regions (LDD/LDS) and more widely spaced S/D regions which are deeper than the extension regions formed in accordance with the well known state of the art of FET devices. The extension/halo or S/D in the substrate 12 aside from the gate electrodes 16G and/or aside from the spacers 22 as well. The implanted dopant 30 may be any n-type or p-type dopant depending on the whether the device 12 is a PMOS (PMIS) device or an NMOS (NMIS) device. If the substrate 12 is doped with n-type dopant, e.g. phosphorus, arsenic or antimony, then the counterdoped regions 30'/30" are doped with p-type dopant, e.g. boron or gallium. In the case of ion implantation of the counterdoped regions 30'/30"

with boron, the conventional process is to employ boron difluoride, and in that case, the present invention protects the gate electrode 16G from introduction of fluorine ions and/or fluorine gas bubbles into the gate electrode 16G. Alternatively, if the substrate 12 is doped with p-type dopant, e.g. boron or gallium, then the counterdoped regions 30'/30" are doped with n-type dopant, e.g. phosphorus, arsenic or antimony. The channel of the FET device 10 is located in the substrate 12 between the regions 30'/30".

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming an FET device on a doped semiconductor substrate on which a gate electrode stack comprising a gate dielectric and a gate electrode with a top surface have been formed comprising:
   forming a gate electrode stack on the substrate comprising a thin gate dielectric layer and a gate electrode layer;
   depositing a first planarizing film blanketing the substrate and the gate electrode stack;
   planarizing the first planarizing film to form an upper surface of the first planarizing layer thereby exposing the gate electrode;
   etching back an upper portion of the gate electrode below the level of the upper surface of the first planarizing film;
   depositing a second planarizing film blanketing the top of the gate electrode and the first planarizing film;
   planarizing the second planarizing film to expose the first planarizing film while forming a second planarizing film cap covering the top surface of the gate electrode;
   selectively removing the first planarizing film, thereby opening access for implantation into lateral regions in the surface of the substrate aside from the gate electrode stack whereby the counterdoped regions can be formed; and
   forming the counterdoped regions by implanting dopant into the substrate using the second planarizing film block to block layer the dopant from implantation into the gate electrode;
   whereby the second planarizing film cap protects the gate electrode of the FET device from unwanted implanted impurities during implanting of the counterdoped regions.

2. The method of claim 1 wherein the first planarizing film is composed of a material selected from the group consisting of silicon oxide and silicon nitride, an interlevel-dielectric layer material including ONO, and photoresist.

3. The method of claim 1 wherein the gate electrode is composed of a material selected from the group consisting of polysilicon and metal.

4. The method of claim 1 wherein the second planarizing film is composed of a material selected from the group consisting of silicon oxide, silicon nitride, and an organic layer including ARCs (Anti-Reflective Coatings).

5. The method of claim 1 wherein the second planarizing film is composed of a material different from the first planarizing film.

6. The method of claim 1 wherein:
   the first planarizing film is composed of a material selected from the group consisting of silicon oxide and silicon nitride, an interlevel-dielectric layer material including ONO, and photoresist; and
   the gate electrode is composed of a material selected from the group consisting of polysilicon and metal.

7. The method of claim 6 wherein the second planarizing film is composed of a material selected from the group consisting of silicon oxide, silicon nitride, and an organic layer including ARCs (Anti-Reflective Coatings).

8. The method of claim 7 wherein the second planarizing film is composed of a material different from the first planarizing film.

9. The method of claim 1 wherein:
   the first planarizing film is composed of a material selected from the group consisting of silicon oxide and silicon nitride, an interlevel-dielectric layer material including ONO, and photoresist; and
   the second planarizing film is composed of a material selected from the group consisting of silicon oxide, silicon nitride, and an organic layer including ARCs (Anti-Reflective Coatings).

10. A method for protecting the gate electrode of an FET device from unwanted implanting of dopant during implanting to form counterdoped regions in a doped semiconductor substrate aside from and proximate to the gate electrode stack, comprising:
    forming a gate electrode stack on a substrate, wherein the gate electrode is formed of a thin gate dielectric layer and a gate electrode layer;
    depositing a first planarizing film on the substrate,
    planarizing the first planarizing film to form an upper surface of the first planarizing film thereby exposing the gate electrode;
    etching back a portion of the gate electrode;
    depositing a second planarizing film on top of the gate electrode;
    planarizing the second planarizing film to expose the first planarizing film while forming a cap comprising an implantation block from the second planarizing film covering the top surface of the gate electrode;
    removing the first planarizing film, thereby opening access for implantation into the surface of the substrate whereby the counterdoped regions can be formed; and
    forming the counterdoped regions by implanting dopant into the substrate,
    whereby the second planarizing film protects the gate electrode from implanting of the dopant therein.

11. The method of claim 10 wherein the first planarizing film is composed of a material selected from the group consisting of HDP (high density plasma) silicon oxide and HDP silicon nitride, an interlevel-dielectric layer material including ONO, and photoresist.

12. The method of claim 10 wherein the gate electrode is composed of a material selected from the group consisting of polysilicon and metal.

13. The method of claim 10 wherein the second planarizing film is composed of a material selected from the group consisting of HDP silicon oxide, HDP silicon nitride, and an organic layer including ARCs (Anti-Reflective Coatings).

14. The method of claim 10 wherein the second planarizing film is composed of a material different from the first planarizing film.

15. The method of claim 10 wherein:
the first planarizing film is composed of a material selected from the group consisting of HDP (high density plasma) silicon oxide and HDP silicon nitride, an interlevel-dielectric layer material including ONO, and photoresist; and
the gate electrode is composed of a material selected from the group consisting of polysilicon and metal.

16. The method of claim 15 wherein the second planarizing film is composed of a material selected from the group consisting of HDP silicon oxide, HDP silicon nitride, and an organic layer including ARCs (Anti-Reflective Coatings).

17. A method for protecting the gate electrode of an FET device from unwanted implanting of dopant during implanting to form counterdoped regions in a doped semiconductor substrate aside from and proximate to the gate electrode stack, comprising:
forming a gate electrode stack on a substrate, wherein the gate electrode is formed of a thin gate dielectric layer and a gate electrode layer;
depositing a first planarizing film on the substrate composed of a material selected from the group consisting of HDP (high density plasma) silicon oxide and HDP silicon nitride, an interlevel-dielectric layer material including ONO, and photoresist,
etching back a portion of the gate electrode to a depth between about 100 Å and about 500 Å;
depositing a second planarizing film on top of the gate electrode composed of a material selected from the group consisting of HDP silicon oxide, HDP silicon nitride, and an organic layer including ARCs (Anti-Reflective Coatings) to a thickness between about 100 Å and about 1000 Å, the second planarizing film being composed of a material different from the first planarizing film;
planarizing the second planarizing film to expose the first planarizing film while forming a cap comprising an implantation block from the second planarizing film covering the top surface of the gate electrode by an etching process selected from RIE and plasma etching;
selectively removing the first planarizing film, thereby opening access for implantation into the surface of the substrate in a wet or dry etching process whereby the counterdoped regions can be formed; and
forming the counterdoped regions by implanting dopant into the substrate,
whereby the second planarizing film protects the gate electrode from implanting of the dopant therein.

18. The method of claim 17 wherein the first planarizing film is composed of a material selected from silicon oxide and BPSG which are etched away either in bath comprising an aqueous solution of hydrogen fluoride or a dry etch using $CHF_3/CF_4$.

19. The method of claim 17 wherein the second planarizing film is composed of a material selected from an acrylic elastomer, polyacrylate rubber, polyimide, and ARC.

20. The method of claim 17 wherein
the first planarizing film is composed of a material selected from HDP silicon oxide/silicon nitride ($SiO_2$/$Si_3N_4$), a (CMP) interlayer dielectric layer, and ONO (silicon Oxide/silicon Nitride/silicon Oxide), and
the first planarizing film is planarized by a method selected from self-planarization and polishing.

* * * * *